(12) United States Patent
Chaki (10) Patent No.: US 8,659,304 B2
(45) Date of Patent: Feb. 25, 2014

(54) HIGH FREQUENCY CHARACTERISTIC MEASURING DEVICE

(75) Inventor: Shin Chaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 282 days.

(21) Appl. No.: 13/324,382

(22) Filed: Dec. 13, 2011

(65) Prior Publication Data

US 2012/0293184 A1 Nov. 22, 2012

(30) Foreign Application Priority Data

May 18, 2011 (JP) ................................. 2011-111075

(51) Int. Cl.
*G01R 27/02* (2006.01)

(52) U.S. Cl.
USPC ........................................................ 324/612

(58) Field of Classification Search
USPC ......... 324/612, 762.01–762.1, 754.01–754.3; 257/48; 437/14–18
See application file for complete search history.

(56) References Cited

U.S. PATENT DOCUMENTS 7,019,543 B2 * 3/2006 Quon ............................ 324/713
7,378,832 B2 * 5/2008 Sutono et al. .............. 324/76.19

FOREIGN PATENT DOCUMENTS

| JP | 2005-223170 A | 8/2005 |
| JP | 2006-308528 A | 11/2006 |
| JP | 2007-295367 A | 11/2007 |
| JP | 2008-45898 A | 2/2008 |
| JP | 2010-25765 A | 2/2010 |

* cited by examiner

*Primary Examiner* — Tung X Nguyen
(74) *Attorney, Agent, or Firm* — Leydig, Voit & Mayer, Ltd.

(57) ABSTRACT

A high frequency characteristic measuring device for measuring high frequency characteristics of a high frequency device to be measured by contacting probe needles with the high frequency device to be measured, before mounting of the high frequency device to be measured. The high frequency characteristic measuring device includes an input matching circuit substrate with an input matching circuit thereon, a first coaxial connector electrically connected to the input matching circuit substrate, and first probe needles electrically connected to the input matching circuit substrate. The high frequency characteristic measuring device further includes an output matching circuit substrate with an output matching circuit thereon, a second coaxial connector electrically connected to the output matching circuit substrate, and second probe needles electrically connected to the output matching circuit substrate.

11 Claims, 6 Drawing Sheets

HIGH FREQUENCY CHARACTERISTIC MEASURING DEVICE

BACKGROUND OF THE INVENTION

1. Field of the Invention

The present invention relates to a high frequency characteristic measuring device used to measure the high frequency characteristics of a device.

2. Background Art

Japanese Laid-Open Patent Publication No. 2005-223170 discloses a coplanar type high frequency characteristic measuring device, which has only one signal transmission probe needle (hereinafter referred to simply as a "probe needle").

Some large-size devices, for example, have a plurality of pads on both its input and output sides. The high frequency characteristics of such devices cannot be measured by coplanar type high frequency characteristic measuring devices, since these measuring devices have only one probe needle.

Therefore in the case of devices with a plurality pads, it has been common practice to measure their high frequency characteristics after they are mounted in a package. As a result, considerable cost and time is required to measure the high frequency characteristics of devices having a plurality of pads.

SUMMARY OF THE INVENTION

The present invention has been made to solve the above problem. It is, therefore, an object of the present invention to provide a high frequency characteristic measuring device capable of measuring the high frequency characteristics of a device having a plurality pads quickly and at low cost.

According to one aspect of the present invention, a high frequency characteristic measuring device for measuring high frequency characteristics of a device by contacting probe needles with the device to be measured before mounting of the device to be measured, the high frequency characteristic measuring device includes an input matching circuit substrate with an input matching circuit formed thereon, a first coaxial connector electrically connected to the input matching circuit substrate, a plurality of first probe needles electrically connected to the input matching circuit substrate, an output matching circuit substrate with an output matching circuit formed thereon, a second coaxial connector electrically connected to the output matching circuit substrate, and a plurality of second probe needles electrically connected to the output matching circuit substrate.

Other and further objects, features and advantages of the invention will appear more fully from the following description.

BRIEF DESCRIPTION OF THE DRAWINGS

FIG. 8 includes FIGS. 8A and 8B which are cross-sectional views of a high frequency characteristic measuring device in accordance with a fourth embodiment of the present invention;

DETAILED DESCRIPTION OF THE PREFERRED EMBODIMENTS

First Embodiment

Figure 1:
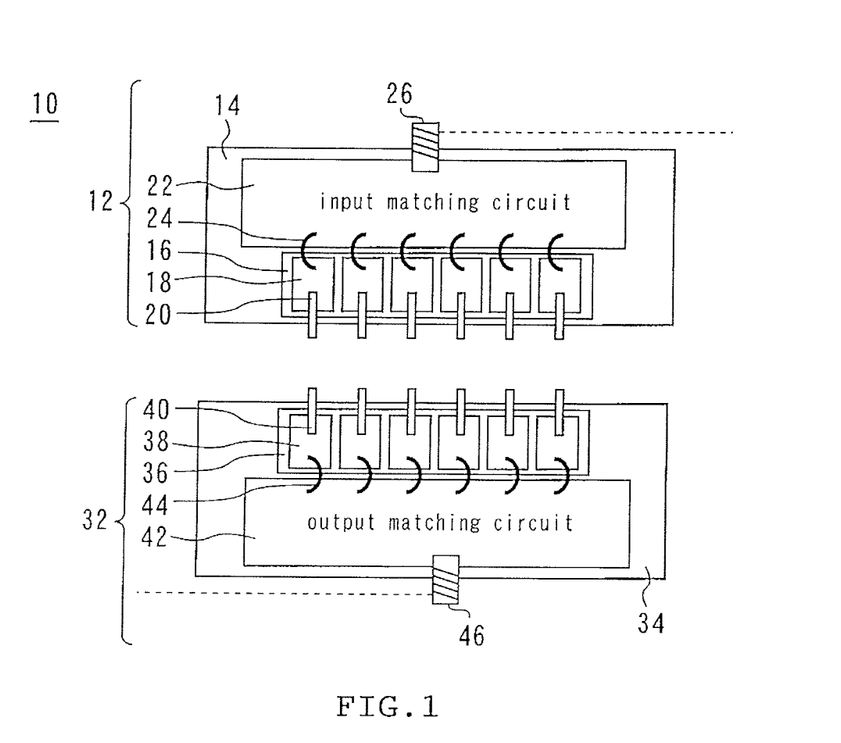
FIG. 1 is a diagram showing a high frequency characteristic measuring device in accordance with a first embodiment of the present invention.

FIG. 1 is a diagram showing a high frequency characteristic measuring device 10 in accordance with a first embodiment of the present invention. The high frequency characteristic measuring device 10 has an input portion 12 and an output portion 32. The input portion 12 includes a first plate 14. The first plate 14 is covered on its surface with metal. A first connection substrate 16 is secured to the first plate 14. A plurality of pads 18 are formed on the first connection substrate 16. Each of the plurality of pads 18 is formed of conductive material. A plurality of first probe needles 20 are secured to their respective pads 18. That is, each pad 18 has a different first probe needle 20 secured thereto. Thus, the first probe needles 20 are secured to the pads 18 of the first connection substrate 16.

An input matching circuit substrate 22 with an input matching circuit formed thereon is secured to the first plate 14. The input matching circuit substrate 22 and the pads 18 are connected together by first wires 24 bonded thereto. Thus the input matching circuit substrate 22 is electrically connected to the plurality of first probe needles 20 through the plurality of first wires 24. Further, a first coaxial connector 26 is electrically connected to the input matching circuit substrate 22. The first coaxial connector 26 is connected to an external tuner, etc.

The output portion 32 will now be described. The output portion 32 includes a second plate 34. The second plate 34 is covered on its surface with metal. A second connection substrate 36 is secured to the second plate 34. A plurality of pads 38 are formed on the second connection substrate 36. Each of the plurality of pads 38 is formed of conductive material. A plurality of second probe needles 40 are secured to their respective pads 38. That is, each pad 38 has a different second probe needle 40 secured thereto. Thus, the second probe needles 40 are secured to the pads 38 of the second connection substrate 36.

An output matching circuit substrate 42 with an output matching circuit formed thereon is secured to the second plate 34. The output matching circuit substrate 42 and the pads 38 are connected together by second wires 44 bonded thereto. Thus the output matching circuit substrate 42 is electrically connected to the plurality of second probe needles 40 through the second wires 44. Further, a second coaxial connector 46 is electrically connected to the output matching circuit substrate 42. The second coaxial connector 46 is connected to an external tuner, etc.

Figure 2:
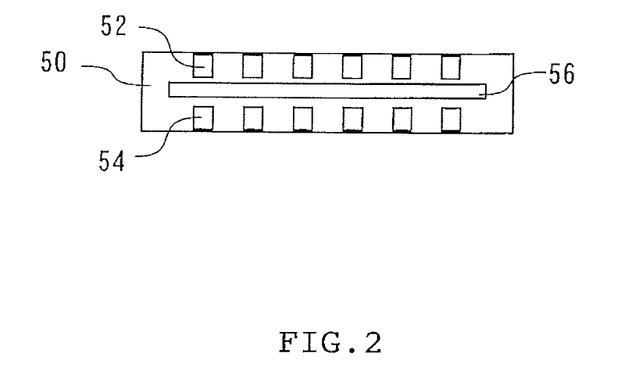
FIG. 2 is a diagram showing a transistor to be measured by the high frequency characteristic measuring device.

FIG. 2 is a diagram showing a transistor 50 to be measured by the high frequency characteristic measuring device. The transistor 50 is a device formed on a wafer. That is, the transistor 50 is in an "on-wafer" state before it is mounted in a package, etc. The on-wafer transistor 50 is provided with a plurality of gate pads 52 and a plurality of drain pads 54. The transistor 50 has a channel region 56 extending along its longitudinal direction.

Figure 3:
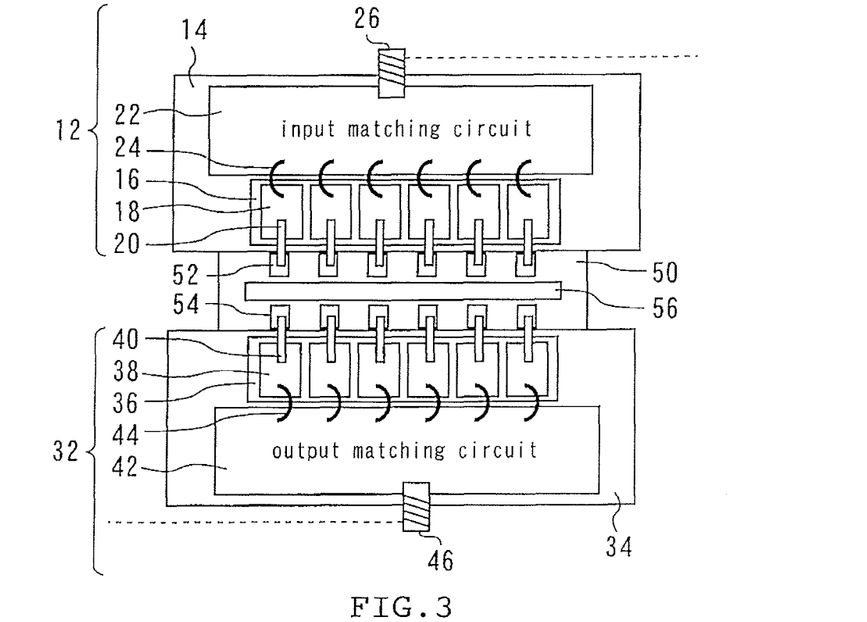
FIG. 3 is a diagram showing a method of measuring the high frequency characteristics of the transistor by use of the high frequency characteristic measuring device of the first embodiment.

FIG. 3 is a diagram showing a method of measuring the high frequency characteristics of the transistor 50 by use of the high frequency characteristic measuring device 10 of the first embodiment. When measuring the high frequency characteristics of the transistor 50 by use of the high frequency characteristic measuring device 10, the first probe needles 20 are contacted with their respective gate pads 52, and the second probe needles 40 are contacted with their respective drain pads 54.

Further, the first coaxial connector 26 and the second coaxial connector 46 are connected to an external tuner. Calibration is then performed so that the characteristic impedance at the end face of the coaxial connector 26 is 50Ω. The dashed lines in FIG. 1 indicate calibration at the end faces of the coaxial connectors.

The high frequency characteristics of the transistor 50 are then measured using the high frequency characteristic measuring device 10 in the following manner. A high frequency signal is input from the first coaxial connector 26 and passes through the input matching circuit of the input matching circuit substrate 22, the first wires 24, the pads 18, and the first probe needles 20 to reach the gate pads 52 of the transistor 50.

This high frequency signal is then amplified by the transistor 50 and passes through the second probe needles 40, the pads 38, the second wires 44, and the output matching circuit of the output matching circuit substrate 42 to reach the second coaxial connector 46. In this way, various electrical characteristics of the transistor 50 are evaluated by use of the external tuner.

Some transistors having a large gate width are provided with a plurality of gate pads (or input signal pads) and a plurality of drain pads (or output signal pads). It has been common practice that such a transistor having a large gate width is mounted in an internal matching HPA (High Power Amplifier) package, etc. when its high frequency characteristics are measured. Thus, transistors having a plurality of gate pads and a plurality of drain pads, for example, need to be mounted in a package when their high frequency characteristics are measured. In such cases, the cost of the package increases the measurement cost, and it takes time to mount these transistors in the package, preventing rapid measurement of their high frequency characteristics.

The high frequency characteristic measuring device 10 of the first embodiment, however, can be used to measure the high frequency characteristics of a transistor in an on-wafer state, i.e., without mounting it in a package. As a result, the high frequency characteristics of the transistor can be measured quickly and at low cost.

Further, the input matching circuit and the output matching circuit of the high frequency characteristic measuring device may be designed to be equivalent to those of the package in which the transistor is eventually mounted, making it possible to determine the high frequency characteristics of the transistor when mounted in the package without actually mounting it. This allows one to quickly determine a suitable circuit configuration for the package.

Although the high frequency characteristic measuring device 10 of the present embodiment is adapted to measure the high frequency characteristics of the transistor 50, it is to be understood that the present embodiment may be applied to any device having a plurality of input signal pads and a plurality of output signal pads.

It should be noted that some transistors are provided with ground pads for their source. Therefore, the high frequency characteristic measuring device 10 of the first embodiment may be provided with probe needles for contact with such ground pads.

In the present embodiment, the input matching circuit substrate 22 and the pads 18 are connected to each other by the first wires 24, and the output matching circuit substrate 42 and the pads 38 are connected to each other by the second wires 44. It is to be understood, however, that in other embodiments these interconnections may be implemented by bump structures, such as those used for flip chip bonding.

Second Embodiment

Figure 4:
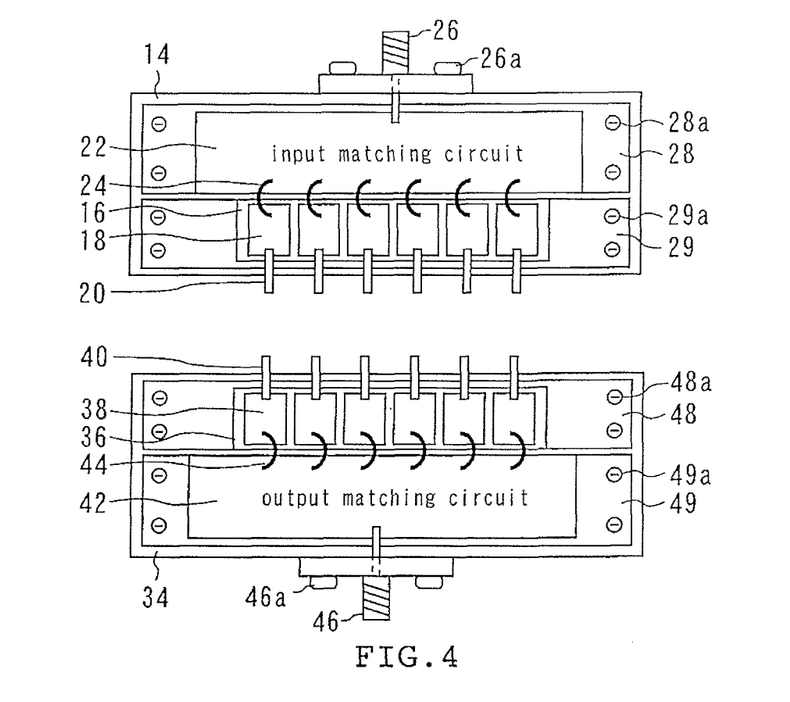
FIG. 4 is a diagram showing a high frequency characteristic measuring device in accordance with a second embodiment of the present invention.

FIG. 4 is a diagram showing a high frequency characteristic measuring device in accordance with a second embodiment of the present invention. Components of this high frequency characteristic measuring device which are identical to those described above in connection with the first embodiment are designated by the same reference numerals and will not be further described herein. This also applies to subsequently described figures.

The input matching circuit substrate 22 is secured to a detachable substrate 28. The detachable substrate 28 is secured to the first plate 14 by screws 28a. The first connection substrate 16 is secured to a detachable substrate 29. The detachable substrate 29 is secured to the first plate 14 by screws 29a. The first coaxial connector 26 is secured to the first plate 14 by screws 26a.

The output matching circuit substrate 42 is secured to a detachable substrate 49. The detachable substrate 49 is secured to the second plate 34 by screws 49a. The second connection substrate 36 is secured to a detachable substrate 48. The detachable substrate 48 is secured to the second plate 34 by screws 48a. The second coaxial connector 46 is secured to the second plate 34 by screws 46a.

In the high frequency characteristic measuring device of the second embodiment, the input matching circuit substrate 22 may be removed and replaced by another input matching circuit substrate. Further, the output matching circuit substrate 42 may be removed and replaced by another output matching circuit substrate. Therefore, this high frequency characteristic measuring device can be used to measure the high frequency characteristics of a device by use of a plurality of input matching circuit substrates and a plurality of output matching circuit substrates, making it possible to readily optimize the characteristics of the device or the package containing the devise.

In the high frequency characteristic measuring device of the second embodiment, the first connection substrate 16 and the second connection substrate 36 may be removed and replaced by other connection substrates. This means that the high frequency characteristic measuring device can accommodate transistors which differ in the number or width of input signal pads (or output signal pads) by using connection substrates having probe needles matching the pads of each transistor.

In the high frequency characteristic measuring device of the second embodiment, the first coaxial connector 26 and the second coaxial connector 46 may be removed and replaced by other coaxial connectors. This means, for example, that a broken coaxial connector can be readily replaced by a new coaxial connector. Further, coaxial connectors having different shapes may be used depending on the measurement environment.

Figure 5:
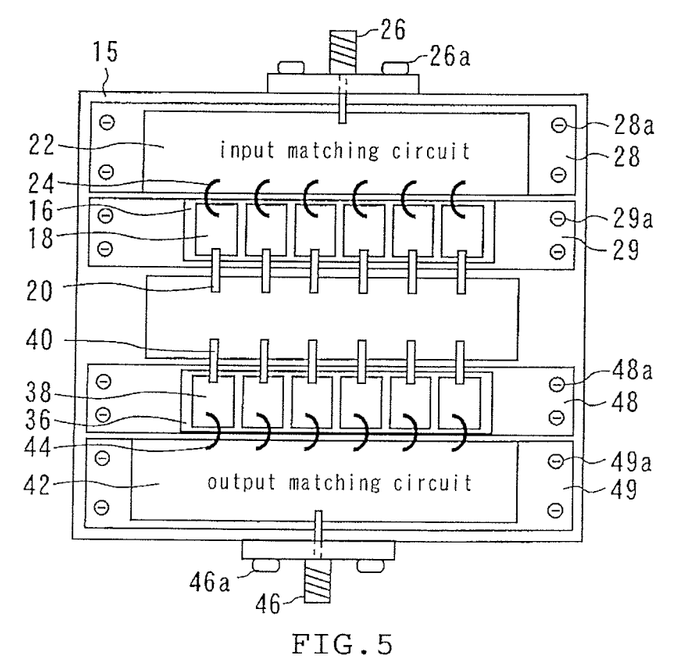
FIG. 5 is a diagram showing a variation of the high frequency characteristic measuring device of the second embodiment.

FIG. 5 is a diagram showing a variation of the high frequency characteristic measuring device of the second embodiment. In this high frequency characteristic measuring device, the detachable substrates 28, 29, 48, and 49 and the first and second coaxial connectors 26 and 46 are detachably secured to a single plate 15. That is, it is possible to remove and replace the input matching circuit substrate 22, the first connection substrate 16, the first coaxial connector 26, the output matching circuit substrate 42, the second connection substrate 36, and the second coaxial connector 46. Since these components are mounted on the same plate 15, the probe needles 20 and 40 can be contacted at once with all pads of the device to be measured.

In the high frequency characteristic measuring device of the second embodiment, each detachable substrate with a component secured thereto is secured to the first plate 14 or the second plate 34 by screws, making it possible to replace the component. It is to be understood, however, that the present invention is not limited to this particular method of replacing components. For example, the input matching circuit substrate 22, the first connection substrate 16, and the first coaxial connector 26 may be detachably secured to the first plate, while the output matching circuit substrate 42, the second connection substrate 36, and the second coaxial connector 46 may be detachably secured to the second plate.

Although in the high frequency characteristic measuring device of the second embodiment a plurality of components can be replaced, it is to be understood that the measuring device may be constructed so that only an intended one of these components can be replaced.

Further, for example, the input matching circuit substrate 22 and the first connection substrate 16 may be secured to the same detachable substrate. It should be noted that the high frequency characteristic measuring device of the second embodiment is susceptible of at least alterations similar to those that can be made to the high frequency characteristic measurement device of the first embodiment. (This also applies to subsequently described embodiments.)

Third Embodiment

Figure 6:
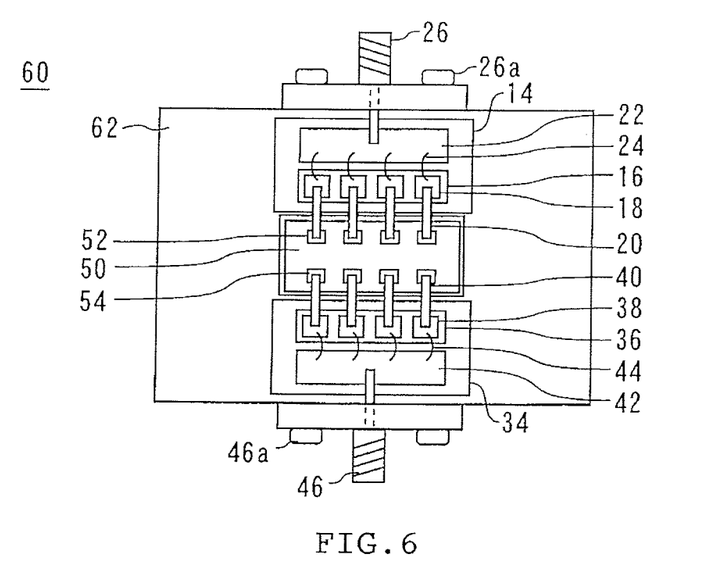
FIG. 6 is a diagram showing a high frequency characteristic measuring device in accordance with a third embodiment of the present invention.

FIG. 6 is a diagram showing a high frequency characteristic measuring device 60 in accordance with a third embodiment of the present invention. In this high frequency characteristic measuring device 60, the first plate 14 and the second plate 34 are formed on a single plate 62.

With this arrangement, the first probe needles 20 and the second probe needles 40 can be readily brought into contact with the gate pads 52 and the drain pads 54, respectively, of the transistor 50 at once. This especially facilitates the handling of the probe needles in a total inspection (measurement) of the on-wafer transistors.

Figure 7:
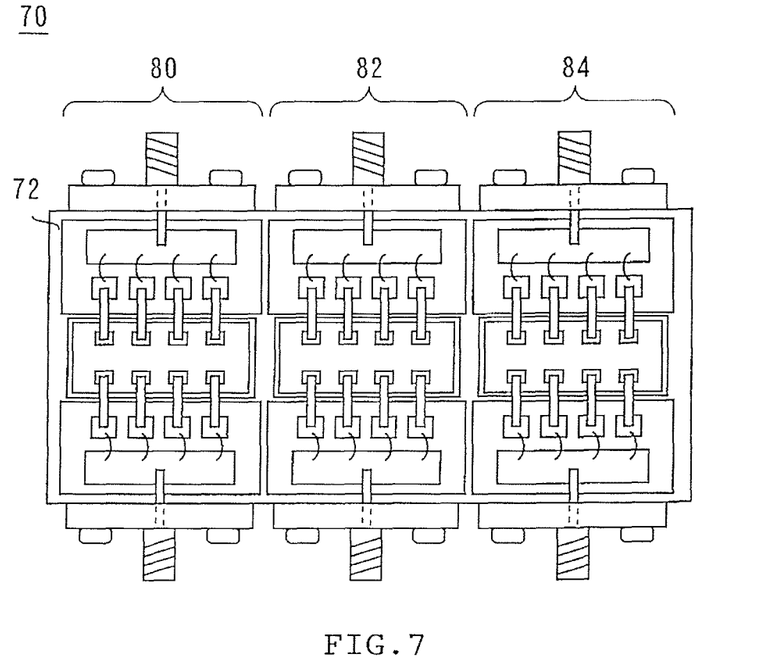
FIG. 7 is a diagram showing a variation of the high frequency characteristic measuring device of the third embodiment.

FIG. 7 is a diagram showing a variation of the high frequency characteristic measuring device of the third embodiment. This high frequency characteristic measuring device 70 includes measuring units 80, 82, and 84. Each measuring unit corresponds to the high frequency characteristic measuring device shown in FIG. 6. Therefore, each measuring unit can be used to measure the high frequency characteristics of a different transistor. All of the measuring units 80, 82, and 84 are secured to the same plate 72. As a result, the characteristics of a plurality of transistors can be measured all at once or continuously by contacting the probe needles with the pads of these transistors simultaneously, resulting in increased throughput. It should be noted that the high frequency characteristic measuring device 70 may include any number of measuring units.

Fourth Embodiment

Figure 8A:
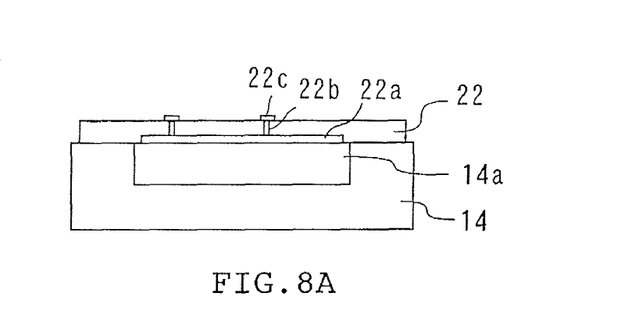
Figure 8B:
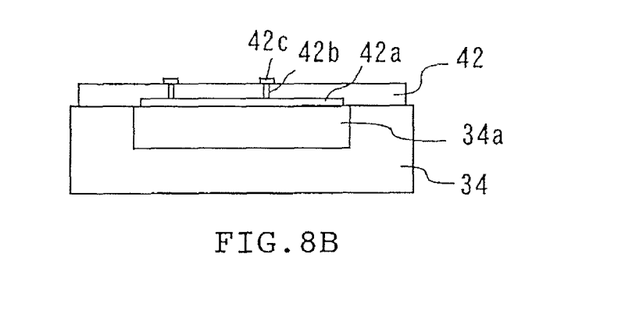

FIG. 8 includes FIGS. 8A and 8B which are cross-sectional views of a high frequency characteristic measuring device in accordance with a fourth embodiment of the present invention. The components of the high frequency characteristic measuring device which are not shown in FIG. 8 are the same as in FIG. 1. FIG. 8A will now be described. A recessed portion 14a is formed in the first plate 14. The input matching circuit substrate 22 is secured to the first plate 14 in such a manner that the surface 22a of the substrate on which the input matching circuit is formed faces the recessed portion 14a.

Through-holes 22b are formed in the input matching circuit substrate 22. A metal pattern 22c is connected to each through-hole 22b. That is, each signal line on the input matching circuit substrate 22 is electrically connected through a respective through-hole 22b to a respective metal pattern 22c exposed at the top surface of the input matching circuit substrate 22. The electrical connection of the input matching circuit substrate 22 to the transistor to be measured is accomplished by connecting the above described first wires between the metal patterns 22c and the input signal pads of the transistor.

FIG. 8B will now be described. A recessed portion 34a is formed in the second plate 34. The output matching circuit substrate 42 is secured to the second plate 34 in such a manner that the surface 42a of the substrate on which the output matching circuit is formed faces the recessed portion 34a.

Through-holes 42b are formed in the output matching circuit substrate 42. A metal pattern 42c is formed in connection to each through-hole 42b. That is, each signal line on the output matching circuit substrate 42 is electrically connected through a respective through-hole 42b to a respective metal pattern 42c exposed at the top surface of the output matching circuit substrate 42. The electrical connection of the output matching circuit substrate 42 to the transistor to be measured is accomplished by connecting the above described second wires between the metal patterns 42c and the output signal pads of the transistor.

When a transistor is mounted in a package, its input matching circuit and output matching circuit are shielded by caps. It should be noted that, in order that the high frequency characteristics of a transistor as measured by a high frequency characteristic measuring device be similar to those of the transistor when mounted in the package, the high frequency characteristic measuring device must preferably provide a measurement environment similar to that in the package. In the high frequency characteristic measuring device of the fourth embodiment, the input matching circuit is shielded by the recessed portion 14a, and the output matching circuit is shielded by the recessed portion 34a. This means that when the transistor is connected to the high frequency characteristic measuring device, the transistor is in an environment similar to that in the package. As a result, the high frequency characteristics of the transistor as measured by the high frequency characteristic measuring device are similar to those of the transistor when mounted in the package.

Further, since the substrate surfaces on which the input and output matching circuits are formed are not exposed to ambient atmosphere, these circuits are unlikely to receive unexpected external mechanical stress.

Fifth Embodiment

Figure 9:
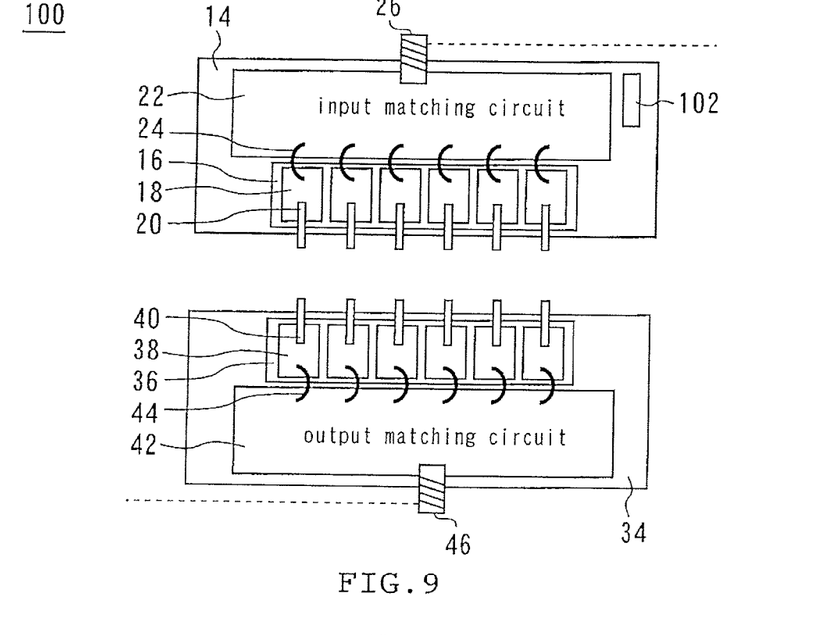
FIG. 9 is a diagram showing a high frequency characteristic measuring device in accordance with a fifth embodiment of the present invention.

FIG. 9 is a diagram showing a high frequency characteristic measuring device 100 in accordance with a fifth embodiment of the present invention. The high frequency characteristic measuring device 100 is characterized in that a DC bias application circuit substrate 102 is secured to the first plate 14.

It is desirable that high frequency characteristic measuring devices for a transistor are adapted to allow for simplification of the entire measuring system while ensuring that the high frequency characteristics of the transistor are measured in an environment similar to that in the package in which it is mounted. Since the high frequency characteristic measuring device 100 incorporates the DC bias application circuit substrate 102, it is possible to simplify the entire measuring system and thereby reduce the burden on the inspector. Specifically, the use of the high frequency characteristic measuring device 100 eliminates the need for bias tees to be incorporated in the external measuring system. Further, for example, by disposing a stabilizing circuit such as a parallel resistance, etc. near the matching circuits, it is possible to measure the high frequency characteristics of the transistor while preventing oscillation.

Sixth Embodiment

Figure 10:
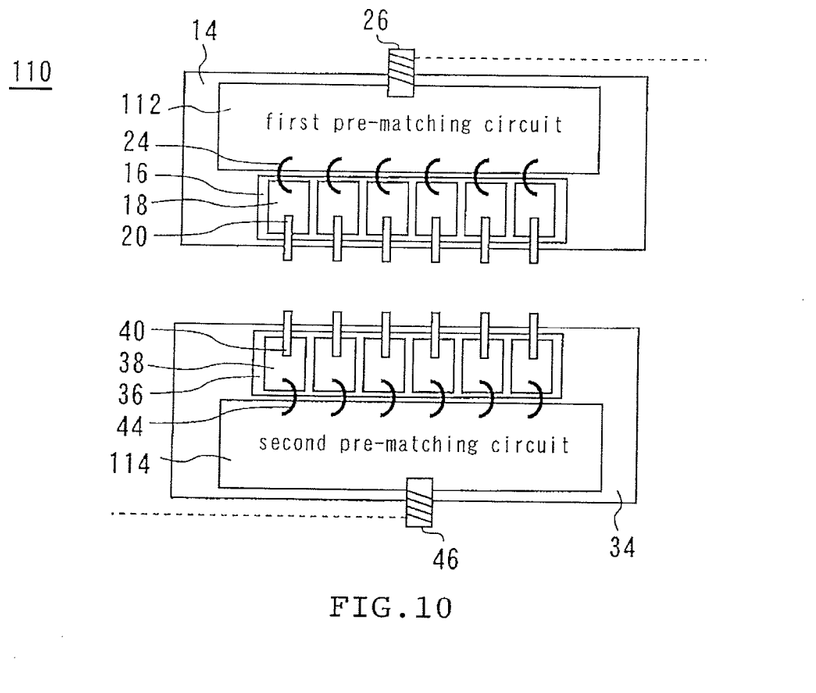
FIG. 10 is a diagram showing a high frequency characteristic measuring device in accordance with a sixth embodiment of the present invention.

FIG. 10 is a diagram showing a high frequency characteristic measuring device 110 in accordance with a sixth embodiment of the present invention. The input matching circuit of the high frequency characteristic measuring circuit 110 is a first pre-matching circuit 112 optimized to measure characteristics of a device. Further, the output matching circuit is a second pre-matching circuit 114 optimized to measure characteristics of the device.

The input matching circuits and the output matching circuits of the high frequency characteristic measuring devices of the first to fifth embodiments are equivalent to those of the package in which the transistor measured by these measuring devices is eventually mounted. The first pre-matching circuit 112 and the second pre-matching circuit 114 of the high frequency characteristic measuring device 110, on the other hand, have a simpler configuration than the input matching circuit and the output matching circuit of the package, and are adapted to measure characteristics of the transistor. For example, the high frequency characteristic measuring device 110 may be used to determine an impedance for extracting the maximum power from the transistor. Further, the high frequency characteristic measuring device 110 makes it possible to readily determine the characteristics of the transistor when the load and source impedances are varied by use of tuners.

Seventh Embodiment

Figure 11:
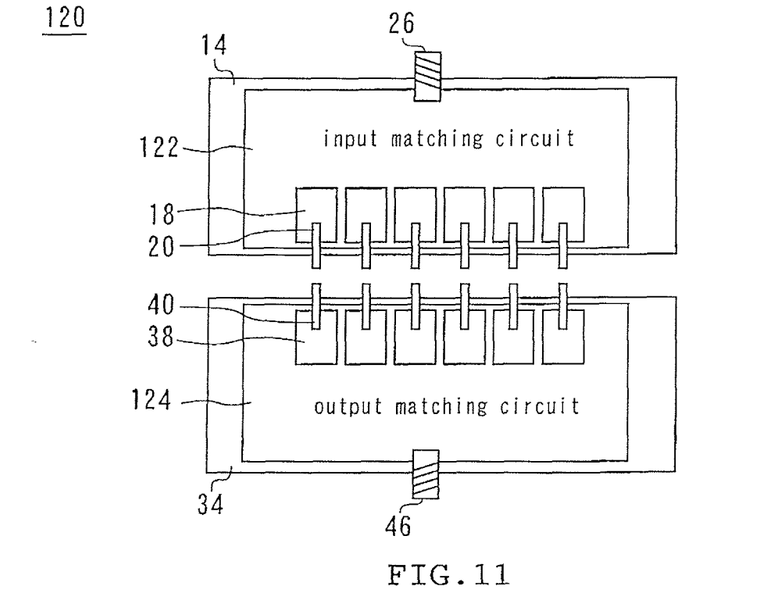
FIG. 11 is a diagram showing a high frequency characteristic measuring device in accordance with a seventh embodiment of the present invention.

FIG. 11 is a diagram showing a high frequency characteristic measuring device 120 in accordance with a seventh embodiment of the present invention. In the high frequency characteristic measuring device 120, the pads 18 are directly connected to an input matching circuit substrate 122, and the pads 38 are directly connected to an output matching circuit substrate 124.

In some cases, the inductance of wires used to measure high frequency characteristics of a transistor prevents accurate measurement. The construction of the high frequency characteristic measuring device 120 avoids this problem by eliminating the need for such wires.

Eighth Embodiment

Figure 12:
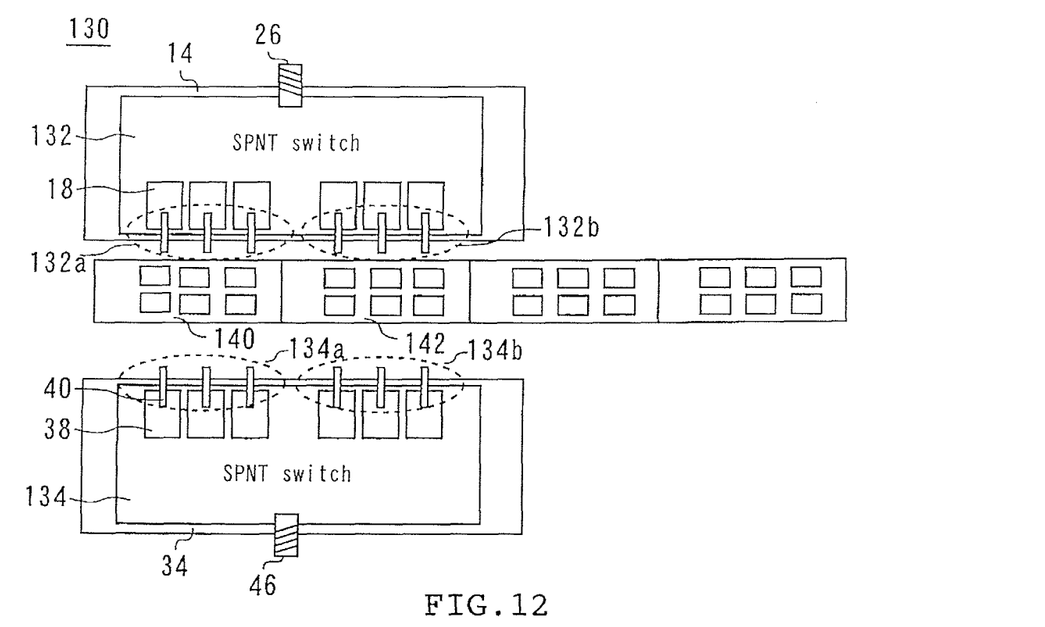
FIG. 12 is a diagram showing a high frequency characteristic measuring device in accordance with an eighth embodiment of the present invention.

FIG. 12 is a diagram showing a high frequency characteristic measuring device 130 in accordance with an eighth embodiment of the present invention. The high frequency characteristic measuring device 130 is characterized in that its input and output matching circuits are SPNT switches 132 and 134, respectively. A first probe needle group 132a and a second probe needle group 132b are secured to the SPNT switch 132. Another first probe needle group 134a and another second probe needle group 134b are secured to the SPNT switch 134.

In a measuring operation, the first probe needle groups 132a and 134a are contacted with a transistor 140, and the second probe needle groups 132b and 134b are contacted with a transistor 142. Thus, with the probe needles being in contact with a plurality of, in this case two, transistors at the same time, the SPNT switches 132 and 134 are operated so as to measure the high frequency characteristics of a selected one of the transistors. This increases the throughput of the measurement.

It should be noted that instead of replacing the matching circuits of the high frequency measuring device of, e.g., the first embodiment with SPNT switches, external SPNT switches may be provided to these matching circuits. This single measuring system can also be used to measure the high frequency characteristics of a plurality of transistors one at a time by operating these SPNT switches.

In the high frequency characteristic measuring device of the eighth embodiment, the number of first probe needles and the number of second probe needles are such that a plurality of devices can be contacted with the first and second probe needles at once. Further, the input matching circuit and the output matching circuit each include a switch for selecting between groups of probe needles to pass a signal through the selected group of probe needles, and these switches are operated so as to measure the plurality of devices sequentially one at a time. Various alterations may be made to the present embodiment without departing from this feature.

In accordance with the present invention there is provided a high frequency characteristic measuring device having a plurality of probe needles which allow the measuring device to measure the high frequency characteristics of a device having a plurality of pads before it is mounted in a package.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-111075, filed on May 18, 2011 including specification, claims, drawings and summary, on which the Convention priority of the present application is based, are incorporated herein by reference in its entirety.

What is claimed is:

1. A high frequency characteristic measuring device for measuring high frequency characteristics of a high frequency device to be measured by contacting probe needles with the high frequency device to be measured, before mounting of the high frequency device to be measured, said high frequency characteristic measuring device, comprising:

an input matching circuit substrate with an input matching located thereon;

a first coaxial connector electrically connected to said input matching circuit substrate;

first probe needles electrically connected to said input matching circuit substrate;

an output matching circuit substrate with an output matching circuit located thereon;

a second coaxial connector electrically connected to said output matching circuit substrate; and second probe needles electrically connected to said output matching circuit substrate.

2. The high frequency characteristic measuring device according to claim 1, further comprising:

a first connection substrate having first pads, each first pad having one of said first probe needles secured thereto;

first wires, each first wire connecting said input matching circuit substrate to one of said pads of said first connection substrate;

a second connection substrate having second pads, each second pad having one of said second probe needles secured thereto; and second wires, each second wire connecting said output matching circuit substrate to one of said second pads of said second connection substrate.

3. The high frequency characteristic measuring device according to claim 1, further comprising:

a first plate to which are detachably secured said input matching circuit substrate and said first coaxial connector; and a second plate to which are detachably secured said output matching circuit substrate and said second coaxial connector.

4. The high frequency characteristic measuring device according to claim 2, further comprising:

a first plate to which are detachably secured said input matching circuit substrate, said first connection substrate, and said first coaxial connector; and a second plate to which are detachably secured said output matching circuit substrate, said second connection substrate, and said second coaxial connector.

5. The high frequency characteristic measuring device according to claim 1, further comprising a plate to which are detachably secured said input matching circuit substrate, said first coaxial connector, said output matching circuit substrate, and said second coaxial connector.

6. The high frequency characteristic measuring device according to claim 2, further comprising a plate to which are detachably secured said input matching circuit substrate, said first connection substrate, said first coaxial connector, said output matching circuit substrate, said second connection substrate, and said second coaxial connector.

7. The high frequency characteristic measuring device according to claim 1, wherein said input matching circuit substrate has a surface on which said input matching circuit is located, said output matching circuit substrate has a surface on which said output matching circuit is located, and said high frequency characteristic further comprises a plate having a recessed portion therein, wherein said input matching circuit substrate is secured to said plate in such a manner that the surface of said input matching circuit substrate on which said input matching circuit is located faces said recessed portion, and said output matching circuit substrate is secured to said plate in such a manner that the surface of said output matching circuit substrate on which said output matching circuit is located faces said recessed portion.

8. The high frequency characteristic measuring device according to claim 1, further comprising a DC bias application circuit substrate.

9. The high frequency characteristic measuring device according to claim 1, wherein:

said input matching circuit is a first pre-matching circuit optimized to measure characteristics of said high frequency device to be measured; and said output matching circuit is a second pre-matching circuit optimized to measure characteristics of said high frequency device to be measured.

10. The high frequency characteristic measuring device according to claim 1, wherein:

said first probe needles are secured to pads directly connected to said input matching circuit substrate; and said second probe needles are secured to pads directly connected to said output matching circuit substrate.

11. The high frequency characteristic measuring device according to claim 1, wherein each of said input matching circuit and said output matching circuit includes a respective switch for selecting between probe needles to pass a signal through the probe needle that is selected.

* * * * *